United States Patent [19]

Suwa et al.

[11] Patent Number: 4,748,478
[45] Date of Patent: May 31, 1988

[54] PROJECTION EXPOSURE APPARATUS

[75] Inventors: Kyoichi Suwa; Hiroshi Tanaka, both of Yokohama, Japan

[73] Assignee: Nippon Kogaku K. K., Tokyo, Japan

[21] Appl. No.: 942,369

[22] Filed: Dec. 16, 1986

[30] Foreign Application Priority Data

Dec. 19, 1985 [JP] Japan .................................. 60-286705

[51] Int. Cl.$^4$ ............................................. G03B 27/42
[52] U.S. Cl. ......................................... 355/53; 355/43
[58] Field of Search ........................ 355/53, 54, 43, 45, 355/77, 125

[56] References Cited

U.S. PATENT DOCUMENTS 4,047,813 9/1977 Spence-Bate ...................... 355/54 X
4,093,373 6/1978 Spence-Bate .......................... 355/54

FOREIGN PATENT DOCUMENTS 221758 6/1985 Japan .

Primary Examiner—Richard A. Wintercorn
Attorney, Agent, or Firm—Shapiro and Shapiro

[57] ABSTRACT

A projection exposure apparatus comprises a wafer stage for supporting a wafer thereon and two-dimensionally moving the wafer along an image plane substantially perpendicular to an optical axis of a projection optical system, first position detecting means for measuring a two-dimensional position of the wafer stage to detect its coordinates with respect to the optical axis of the wafer, a reticle stage for holding different original patterns such that the patterns do not overlap each other and that predetermined central exposure points of the original image patterns are located at predetermined intervals, and for two-dimensionally moving the reticles at a stroke given such that the optical axis of projection passes all central exposure points of the different original patterns, and second position detecting means for detecting a two-dimensional position of the reticle stage according to a coordinate system determined by the first detecting means and a coordinate system having its axes along the same directions as those of the coordinate system determined by the first detecting means.

12 Claims, 6 Drawing Sheets

PROJECTION EXPOSURE APPARATUS

BACKGROUND OF THE INVENTION

1. Field of the Invention

The present invention relates to projection exposure for transferring an image of an original image pattern on a mask or a reticle onto a substrate such as a wafer through a projection optical system.

2. Related Background Art

An exposure apparatus of this type has a projection lens having a high power and can transfer a submicron line pattern onto a semiconductor wafer. The image field of the projection lens is generally small with respect to the entire surface of the wafer. For this reason, so-called step-and-repeat exposure is performed such that a projected image of a pattern formed on a reticle is repeatedly exposed onto the wafer every time the wafer is stepped. In this case, if an identical circuit pattern is repeatedly formed on the entire surface of the wafer, only one reticle is required. However, if a test circuit pattern is partially formed on the wafer, in addition to practical circuit patterns, at least two reticles must be prepared for a given layer. Since two reticles cannot be simultaneously used in a conventional projection exposure apparatus, the reticle for exposing the practical circuit pattern must be replaced with the reticle for forming the test circuit. In this case, alignment marks are formed at the common positions of these reticles, and reticle alignment using the alignment marks is an indispensable operation upon replacement of reticles. Reticle replacement and alignment inevitably require time-consuming operations.

Another conventional technique is disclosed in Japanese Laid-Open Patent Application No. 221758/1985. According to this technique, different circuit patterns (i.e., both practical and test circuits) are preformed on a single reticle. A wafer stage is positioned as follows. A reticle blind is shifted to change the shape and size of an illumination aperture such that the pattern excluding the required circuit pattern is not illuminated with light, and that only the projected image of the required pattern is formed on a predetermined position on the wafer. In this case, the system must be designed such that if the reticle blind is fully open, all the different circuit patterns are exposed on the wafer through the projection lens. Therefore, the sizes of the images of individual circuit patterns within the image field of the projection lens are greatly limited, resulting in inconvenience. Since the image field of the projection lens is divided into small areas, image distortions in the small areas slightly differ from each other. As a result, matching precision during overlapping exposure cannot be improved.

In recent years, a chip integration or wafer integration scheme has been proposed to produce VLSIs. In this case, the size of a circuit pattern image to be transferred is desired to be as large as that limited by only the image field of the projection lens. At the same time, replacement of original image patterns in a short period of time is also desired. When a circuit pattern having a larger size than the maximum shot area determined by the image field or the like of the projection lens is to be formed, screen synthesis must be used. In this case, high-speed original image pattern replacement is desired.

However, no conventional apparatuses satisfy both high speed and high precision on a practical basis. Therefore, strong demand has arisen for developing a projection exposure apparatus which may be suitably used for chip integration, wafer integration, and screen synthesis.

SUMMARY OF THE INVENTION

It is an object of the present invention to provide a projection exposure apparatus, wherein both high-speed original image pattern replacement and matching with high precision, which are suitable for manufacturing VLSIs by chip integration or wafer integration, are simultaneously achieved.

An exposure apparatus according to the present invention comprises: a wafer stage for supporting a wafer thereon and two-dimensionally moving the wafer along an image plane substantially perpendicular to an optical axis of a projection optical system; first position detecting means for measuring a two-dimensional position of the wafer stage to detect its coordinates with respect to the optical axis of the wafer; a reticle stage for holding different original patterns such that the patterns do not overlap each other an that predetermined central exposure points of the original image patterns are located at predetermined intervals, and for two-dimensionally moving the reticles at a stroke given such that the optical axis of projection passes all central exposure points of the different original patterns; and second position detecting means for detecting a two-dimensional position of the reticle stage according to a coordinate system determined by the first detecting means and a coordinate system having its axes along the same directions as those of the coordinate system determined by the first detecting means.

According to the present invention, a chip of a large size can be easily exposed at high speed even if a projection optical system has a relatively small field size.

According to a preferred embodiment of the present invention, a position detector having a high resolution is arranged to allow real-time detection of movement of the reticle stage. The original image pattern replacement time can be greatly shortened. In addition, a projection optical system having a high resolution and a small screen can be used to obtain a high throughput for a composite chip having a large image. Therefore, the projection exposure apparatus according to the present invention is effective to constitute a large-capacity memory and a multifunctional device.

According to the preferred embodiment of the present invention, once the marks on the reticle are aligned with those on the wafer by using an alignment sensor, different patterns can be replaced with respect to this position by open control using a reticle stage interferometer. This indicates that the constitution of the present invention allows die-by-die alignment. The present invention is not limited to exposure of patterns on wafers, but can also be effectively used in a simultaneous exposure apparatus, an X-ray exposure apparatus or the like.

DESCRIPTION OF THE PREFERRED EMBODIMENTS

Figure 1:
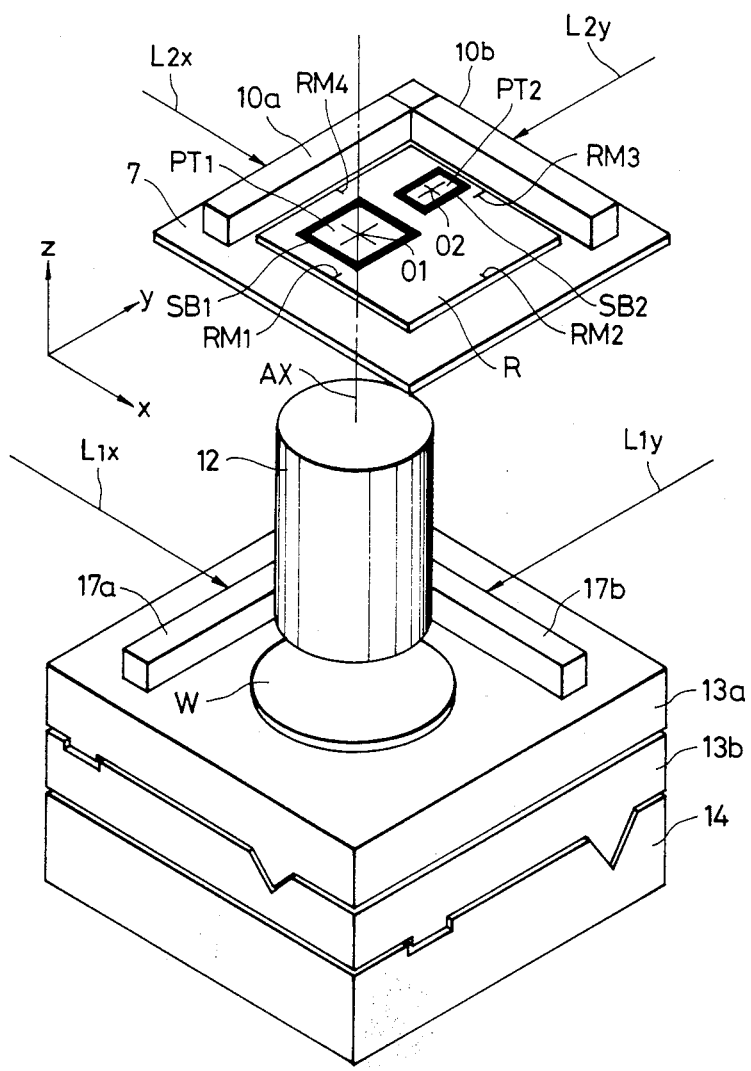
FIG. 1 is a perspective view showing the main part of a projection exposure apparatus according to a first embodiment of the present invention.
Figure 2:
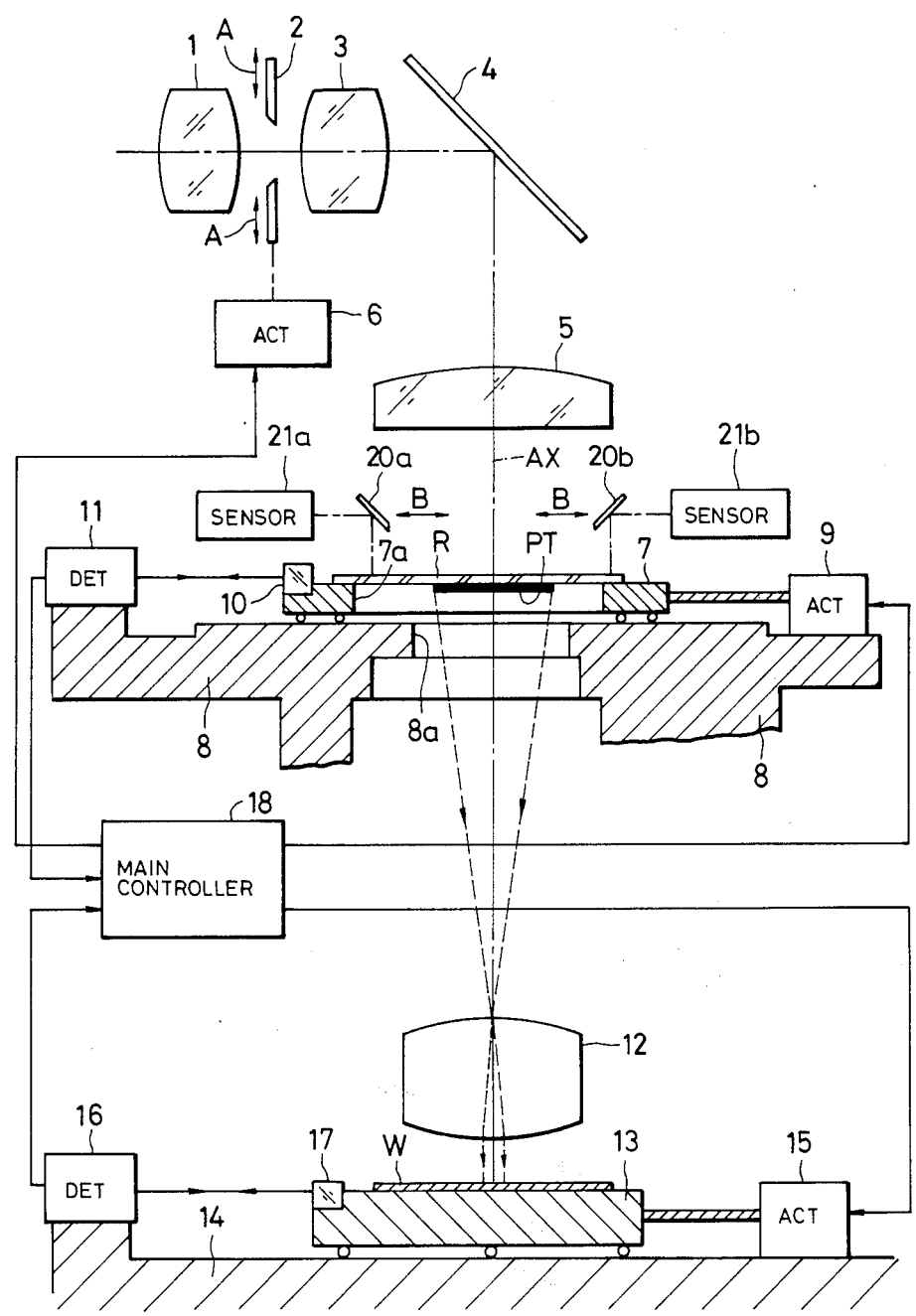
FIG. 2 is a sectional view showing the system configuration of the apparatus in FIG. 1.

In a first embodiment shown in FIGS. 1 and 2, light from an illumination light source (not shown) is reflected by a dichroic mirror 4 through focusing lenses 1, a reticle blind 2 constituting an illumination view aperture, and focusing lenses 3. The reflected light uniformly illuminates a reticle R through a condenser lens 5. The reticle blind 2 has four independently movable blades. Two of the four blades can be moved by a blind actuator 6 in directions of double-headed arrow A, and the remaining two blades can be moved in directions perpendicular to the directions of double-headed arrow A. A rectangular opening defined by the reticle blind 2 is optically conjugate with the surface of a reticle pattern PT. For this reason, an image of the opening is projected on the reticle by the illumination light.

The reticle is placed on a reticle stage 7. The reticle stage 7 is two-dimensionally moved by a driver 9 on a column 8 integrally formed with a fixing portion of the apparatus. An opening 7a for shielding the pattern PT on the reticle is formed in the reticle stage 7. An opening 8a is formed in the upper portion of the column 8 so as not to shield a pattern image of a maximum size to be exposed by the apparatus. A guide surface of the reticle stage 7 is formed at the upper end portion of the column 8.

A mirror 10 is fixed at an end of the reticle stage 7 to reflect a collimated beam from a position detector 11 including a laser interferometer. The detector 11 detects a two-dimensional coordinate position of the reticle stage 7. The laser beam is preferably located within the same plane as that of the reticle pattern PT. The detector 11 is fixed to the column 8.

The reticle pattern image is focused on the wafer W through a projection lens 12. The projection lens 12 is stationarily disposed in the column 8 such that an optical axis AX of the projection lens 12 is perpendicular to the reticle pattern surface and the wafer surface and aligned with the optical axis of the illumination optical system (1, 3, and 5). The wafer is placed on the wafer stage 13 and is two-dimensionally moved by a driver 15 along a base 14 integrally formed with the column 8.

A mirror 17 is fixed on the wafer stage 13 to reflect a collimated laser beam from a position detector 16 including a laser interferometer. The detector 16 measures a two-dimensional coordinate position of the wafer stage 13. The laser beam is located on the surface of the wafer W. Strictly speaking, the laser beam is preferably located on the same plane as that of the focusing plane of the reticle pattern PT by the projection lens 12.

The main controller 18 supplies an instruction for controlling the size of the blind opening to the blind driver 6 and receives position information from the detectors 11 and 16, thereby detecting the positions of the reticle and the wafer. The main controller 18 then supplies predetermined drive instructions to the drivers 9 and 15. The main controller 18 causes the wafer stage 13 to move stepwise in the x and y directions of an xy coordinate system, thereby allowing step-and-repeat exposure. The main controller 18 moves the reticle stage 7 at the time of replacement of patterns PT and slightly moves it at the time of reticle alignment. The operation sequences of the controller 18 in the apparatus will be described in detail later on.

Although omitted in the above description, a $\theta$ table is built into the reticle stage 7 to slightly rotate the reticle on the stage 7. During alignment, the $\theta$ table corrects rotational errors so that the reticle is rotated and held on the stage 7 in the measurement coordinate system of the detector 16.

Referring to FIG. 2, alignment sensors 21a and 21b including mirrors 20a and 20b are arranged between the reticle and the condenser lens 5 to align the reticle with respect to the apparatus. The mirrors 20a and 20b are obliquely disposed to allow observation of the alignment marks formed in a peripheral area of the reticle. The mirrors 20a and 20b may be moved in directions of double-headed arrow B according to the alignment mark positions or may be fixed at predetermined positions. The alignment sensors 21a and 21b preferably comprise an alignment illumination optical system. The alignment sensors 21a and 21b are preferably designed such that the step alignment marks formed in the area of the reticle outside the pattern PT and a reverse-projected image (by the projection lens 12) of the marks formed in the exposure area of the wafer W can be detected when the mirrors 20a and 20b are moved forward along the optical axis AX.

As shown in FIG. 1, two different patterns PT1 and PT2 are formed on the reticle R in this embodiment. The central exposure points of the rectangular patterns PT1 and PT2 are O1 and O2, respectively. A light-shielding band SB1 made of chromium or the like and having a predetermined with is formed around the pattern PT1. A light-shielding band SB2 having a predetermined width is formed around the pattern PT2. The distances between the central points O1 and O2 along the x and y directions are known at the time of reticle design. Two laser beams L2x and L2y from the detector 11 are parallel to the x- and y-axes of the xy coordinate system and incident on mirrors 10a and 10b, respectively. The mirror 10a has a reflecting surface having substantially the same length as that of the y-direction side of the reticle and extending along the y direction. The mirror 10b has a reflecting surface having substantially the same length as that of the x-direction side of the reticle and extending along the x direction. Therefore, the laser beams L2x and L2y are not deviated from the mirrors 10a and 10b within the stroke of the reticle stage 7. The plane including the laser beams L2y and L2x is perpendicular to the optical axis AX. Extension lines of the laser beams L2y and L2x cross at the optical axis AX. Reticle alignment marks RM1, RM2, RM3, and RM4 are respectively formed at four sides of the reticle R. The marks RM1 and RM3 are formed on a line parallel to the y-axis and passing through the center of the reticle, and marks RM2 and RM4 are formed on a line parallel to the x-axis and passing through the center of the reticle.

The wafer stage 13 comprises an x stage 13b moving on the base 14 along the x direction, and a y stage 13a moving on the x stage 13b along the y direction. The two laser beams L1x and L1y from the detector 16 are parallel to the x- and y-axis of the xy coordinate system and are incident on mirrors 17a and 17b. The plane including the laser beams L1x and L1y is perpendicular to the optical axis AX. Extension lines of the laser beams L1x and L1y cross at the optical axis AX.

Figure 3:
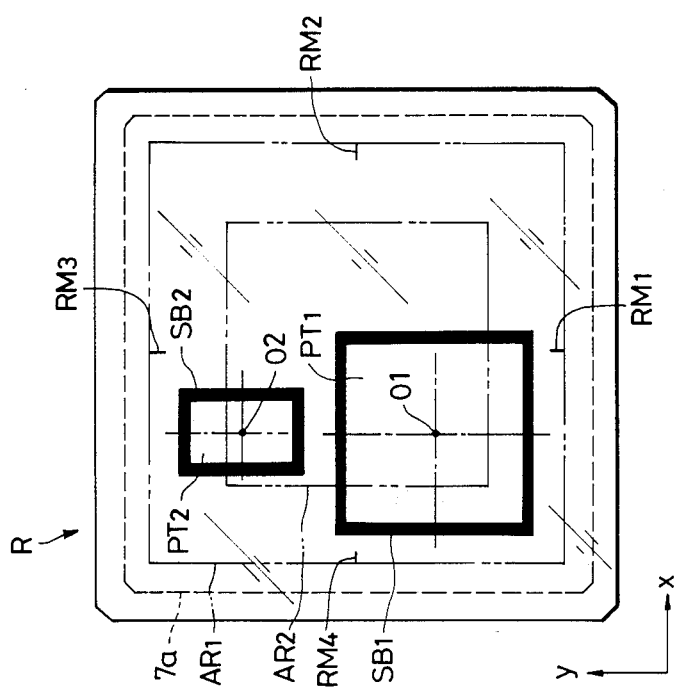
FIG. 3 is a plan view of a reticle.

FIG. 3 is a plan view of the reticle R. The opening 7a of the reticle stage 7 is slightly smaller than the outer dimensions of the reticle. A rectangular area AR1 defined by an imaginary line is an effective projection area limited by the movement stroke of the reticle stage 7. If a pattern or mark is located within the area AR1, it is projected by the projection lens 12. A rectangular area AR2 indicated by an imaginary line and located within the area AR1 is an area in which the central exposure point limited by the movement stroke of the reticle stage 7 is to be present. In other words, if the central exposure point is located within the area AR2, it can be positioned to be always aligned with the optical axis AX of the projection lens 12.

As is apparent from FIG. 3, the patterns PT1 and PT2 are located within the area AR1 but do not overlap each other. At the same time, both the central points O1 and O2 are located within the area AR2. It should be noted that the reticle alignment marks RM1, RM2, RM3, and RM4 are formed within the area AR1, and step alignment marks are added to the patterns PT1 and PT2. Marks S1, S2, S3, and S4 may be radially formed with respect to the center O1 of the pattern PT1, and marks S5, S6, S7, and S8 may be formed with respect to the center O2 of the pattern PT2. In this embodiment, the marks S1 to S4 and S5 to S8 need not be formed. However, these marks are required to check alignment between the reticle and the wafer according to a TTL (Through-The-Lens) system.

Although omitted in FIGS. 1 and 2, a wafer alignment sensor is arranged to detect the alignment marks formed on the wafer to perform global alignment of the wafer or alignment for every shot on the wafer. The widths of the light-shielding bands SB1 and SB2 in FIG. 3 are determined according to position alignment precision of four blades of the reticle blind 2. Assume that the opening of the blind 2 is enlarged with K magnification, and that the enlarged image is formed on the reticle. Assuming that precision of the blade is $\pm a$ (mm) in consideration of reproducibility, the width of each of the light-shielding bands SB1 and SB2 must be 0.2 ak (mm). In addition, the width of the light-shielding bands SB1 and SB2 is also determined in consideration of a defocusing amount on the reticle. For example, if reticles have slightly different thicknesses, even if an edge image of the blind 2 is sharply focused on the pattern surface of a given reticle, the edge image may be slightly defocused on the pattern surface of another reticle. Therefore, the width of the light-shielding bands SB1 and SB2 is determined so as not to cause the defocused edge image in the pattern PT in consideration of dimensional precision of the blades.

Figure 5:
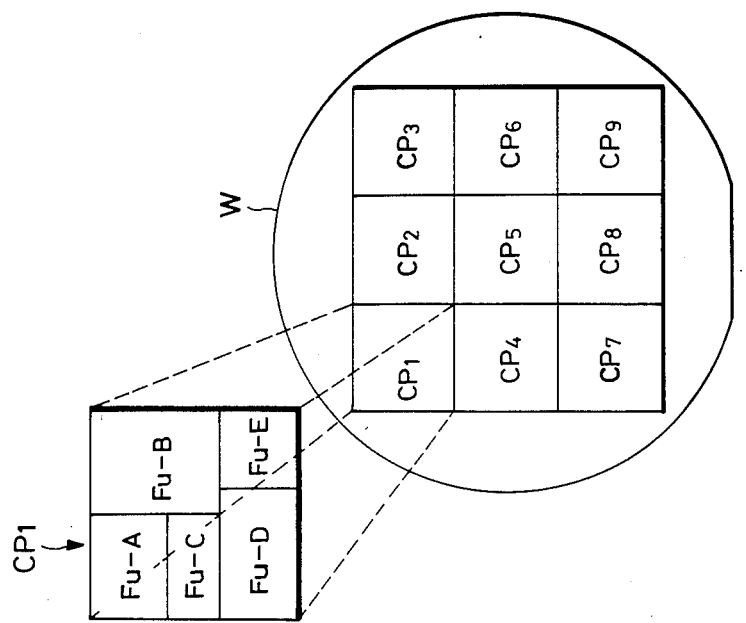
FIG. 5 is a plan view showing a wafer for explaining chip integration by screen synthesis.
Figure 4:
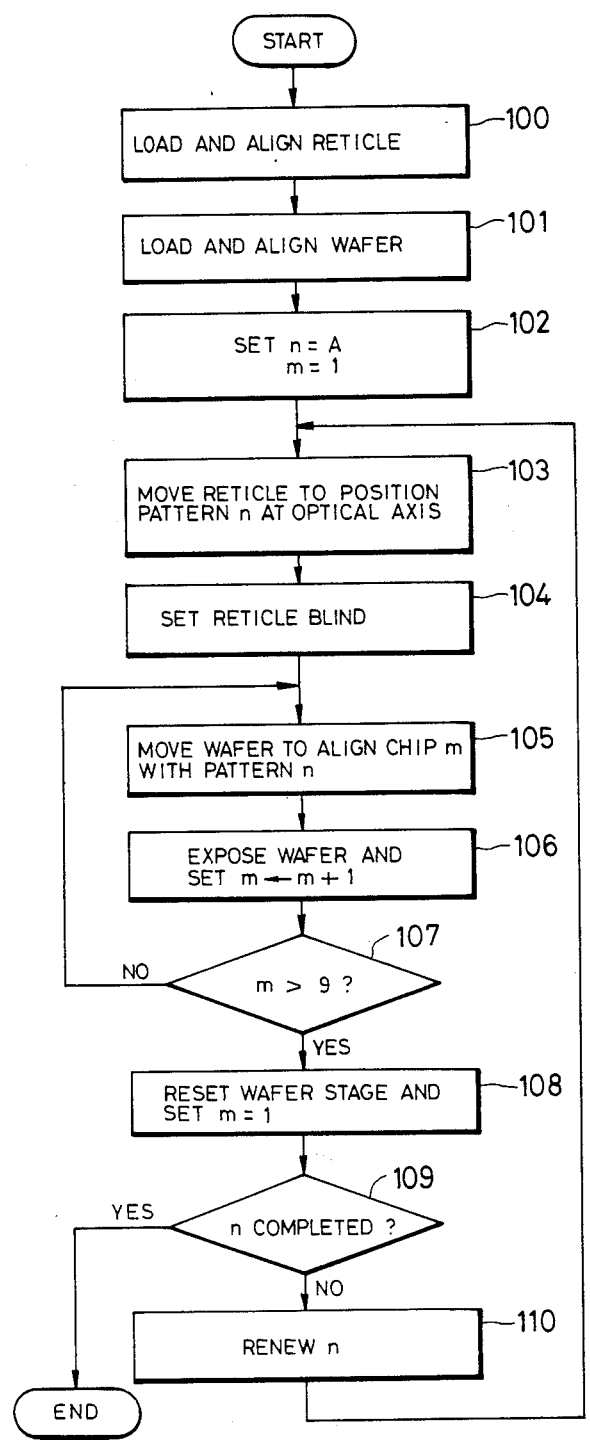
FIG. 4 is a flow chart showing a first operation sequence in the apparatus of FIG. 2.

A typical operation sequence of the apparatus will be described with reference to a flow chart in FIG. 4. An operation will be exemplified wherein a chip integration VLSI obtained by screen synthesis is exposed on a wafer. As shown in FIG. 5, chip integration is defined such that a plurality of circuits having a specific function are simultaneously formed within one chip to be scribed by dicing. Within one chip CP, a functional block Fu-A represents a processor, a functional block Fu-B represents a random access memory (RAM), a functional block Fu-C represents a read-only memory (ROM), a functional block Fu-D represents an analog-to-digital (A/D) or digital-to-analog (D/A) converter, and a functional block Fu-E represents a control section for exchanging information or controlling operation timings of the elements within the chip. The functional blocks can be interconnected as needed.

In this embodiment, as shown in FIG. 5, nine chips CP1 to CP9 are exposed, and five independent circuits are formed in each chip. Therefore, five patterns PT1, PT2, ... and PT5 are formed in the reticle in FIGS. 1 and 3. The pattern number of the patterns PT1, PT2, ... PT5 on the reticle is represented by n (=A, B, C, D, and E), and the chip number on the wafer is represented by m. This operation sequence will be described in an order of steps in the flow chart.

(Step 100)

The reticle is placed at a predetermined position on the reticle stage 7. Reticle alignment is performed by causing the alignment sensors 21a and 21b in FIG. 2 to detect the marks RM1, RM2, RM3, and RM4. At the same time, a small rotational error is also corrected. If the alignment sensors 21a and 21b are integrally mounted on the column 8 in FIG. 2, the detection centers of the alignment sensors 21a and 21b with respect to the marks RM can be regarded as fixed positions separated from the optical axis AX by a predetermined distance. Therefore, upon completion of reticle alignment, the optical axis AX is positioned to pass through the central point of the reticle. The coordinate position of the reticle case in this stage is read by the detector 11 and is stored as a reference position in the main controller 18. In this step, if known fudicial marks are formed on the wafer stage 13, the alignment sensors 21a and 21b detect the fudicial marks through the projection lens 12 so as to match the orthogonal coordinate system of the reticle stage with that of the wafer stage.

(Step 101)

Subsequently, the wafer W is prealigned at a predetermined position on the wafer stage 13, the wafer marks formed at predetermined positions on the wafer are detected, and wafer global alignment is performed. In this case, a small rotational error of the wafer is corrected. Upon completion of global alignment, the positional relationship between a specific point on the wafer and the optical axis AX of the projection lens 12 is defined. The wafer area to be exposed can be aligned with the pattern projection image from the projection lens 12 according to the detection resolution of the detector 16.

(Step 102)

The pattern number n is set to be, e.g., the functional block Fu-A, and the chip number m is set to be, e.g., 1 (a chip CP1).

(Step 103)

If the pattern number n is given as A whose pattern is, e.g., a pattern PT1 in FIG. 1, the main controller 18 reads the measured value form the detector 11 and at the same time controls the driver 9 to shift the reticle stage 7 such that the central point O1 is aligned with the optical axis AX. Since the coordinate point where the central point of the reticle coincides with the optical axis AX is already known, high-speed open control without using the alignment sensors can be performed on the basis of only the measured value from the detector 11. In this case, if a projection magnification of the projection lens 12 is 1/10 (reduction) and a detection resolution of the detector 16 is 0.01 μm, the detection resolution of the detector 11 can be 0.1 μm. This indicates that the reticle stage 7 can be easily shifted at high speed. A maximum speed of the stage 7 can be about 1,000 mm/sec. However, according to practical control, a suitable speed is about 50 to 100 mm/sec. Under this condition, only the pattern replacement time of a few seconds is required. The throughput of the apparatus of this embodiment is higher than that of the conventional apparatus.

(Step 104)

The opening size of the blind 2 is set according to the size of the selected functional block or pattern A (pattern PT1). The opening size of the blind 2 is set by the actuator 6. The operations in steps 103 and 104 can be simultaneously performed in the program sequence.

(Step 105)

The wafer stage 13 is stepped to the position within the chip m (the first chip is CP1) on the wafer where the pattern A is to be exposed. The projected image of the pattern A is aligned with the area (Fu-A) to be exposed within the chip m on the basis of the detection resolution.

(Step 106)

The pattern A (PT1) of the reticle is irradiated with illumination light through the illumination optical system for a predetermined period of time. A photoresist film formed on the surface of the wafer is exposed by the projected image of the pattern A. In this case, the chip number m is incremented by one.

(Step 107)

The main controller 18 determines whether the pattern A is exposed on all chips on the wafer. The wafer constitutes nine chips. If $m \leq 9$, then the flow returns to step 105, and step-and-repeat exposure is performed. It should be noted that the stepping pitch in step 105 is substantially the same as the size of the chip.

(Step 108)

If YES in step 107, the position of the wafer stage 13 is reset, and m=1 is set.

(Step 109)

The main controller 18 then determines whether exposure for all n patterns is completed. If YES in step 109, the main controller 18 determines that entire exposure for one wafer is completed. In this case, the sequence is ended.

(Step 110)

If NO in step 109, the pattern number n is updated to, e.g., B (pattern PT2). At the same time, shot position data for stepping the wafer stage 13 according to the step- and-repeat system is corrected by a distance between the central point of the functional block Fu-A on the wafer and the central point of the functional block Fu-B.

The flow returns to step 103 again, and the same operations as described above are repeated.

Figure 6:
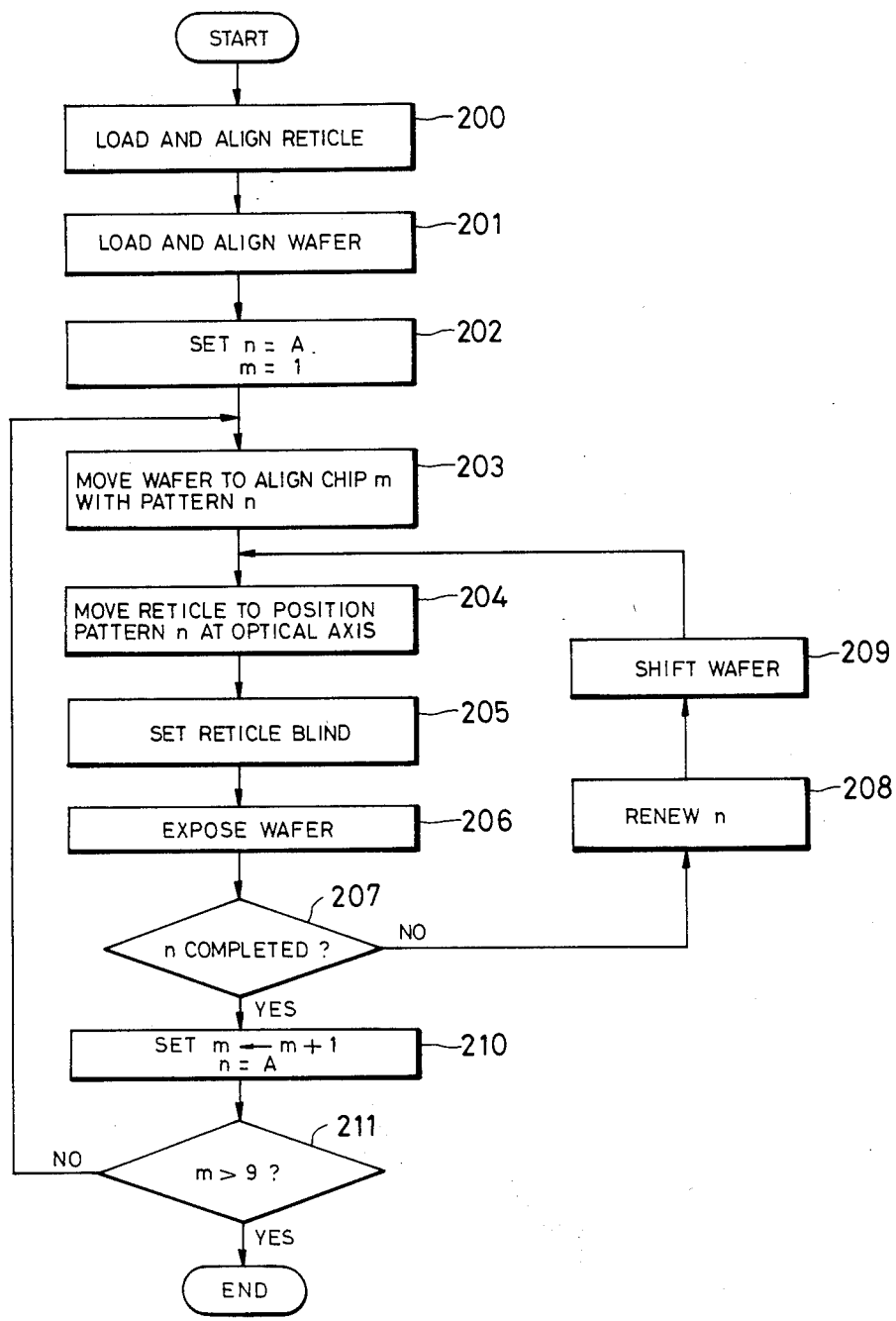
FIG. 6 is a flow chart showing a second operation sequence of the apparatus in FIG. 2.

A modification of the operation sequence described above will be described with reference to a flow chart in FIG. 6. The flow chart in FIG. 6 differs from that of FIG. 4 in that wafer stepping is performed after patterns to be exposed are sequentially replaced and exposed on one chip on the wafer. The operations in steps 200 to 202 in FIG. 6 are the same as those in steps 100 to 102 in FIG. 4.

Step 203 is then executed. The position subjected to exposure in the pattern A within the chip CP1 is positioned. In this case, the position of the wafer stage 13 is stored as a shot position of the chip CP1. In step 204, the reticle stage 7 is positioned such that the pattern A (PT1) is exposed. In step 205, the opening size of the blind 2 is aligned with the pattern A (PT1). In step 206, exposure is performed.

The main controller 18 then determines in step 207 whether all patterns (A, B, C, D, and E) on the reticle have been exposed. If the next pattern B is to be exposed, the flow advances to step 208, and the pattern number n is updated. In step 209, the wafer stage 13 is shifted by a difference between the shot position of the pattern A and the shot position of the pattern B, i.e., the distance between the central points of the functional blocks Fu-A and Fu-B in FIG. 5.

The same operations as described above are repeated from step 204. If the main controller 18 determines in step 207 that all patterns on the reticle have been exposed, the entire exposure cycle of the functional blocks Fu-A to Fu-E for the chip CP1 has been completed. In this case, the flow advances to step 210. In step 210, the chip number m is incremented by one, and the pattern number n is set for A. At the same time, the shot position data of the next chip CP2 is read out. If condition $m \leq 9$ is established in step 211, exposure for all chips has been completed. If condition $m > 9$ is established, the operations are repeated from step 203.

In the sequence of FIG. 6, if control of the reticle stage 7 and control of the wafer stage 13 are independently performed by different processors, the operations in steps 208 and 209 and steps 204 and 205 can be simultaneously performed.

Figure 7:
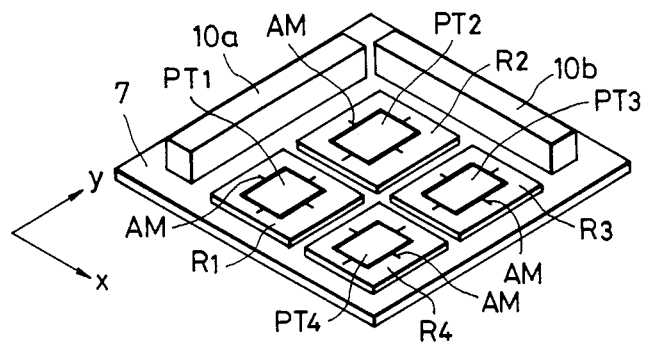
FIG. 7 is a perspective view showing an arrangement of reticle disposition according to a second embodiment of the present invention.

A second embodiment of the present invention will be described with reference to FIG. 7. FIG. 7 shows a case wherein four reticles R1, R2, R3, and R4 having different patterns are disposed on a reticle stage 7. The same effect as in the first embodiment can be obtained even if a plurality of reticles are chucked on the stage 7. Referring to FIG. 7, patterns PT1, PT2, PT3, and PT4 are respectively formed on the reticles R1 to R4. Four alignment marks AM are formed in the peripheral portion of each pattern so as to interpose the light-shielding bands. The reticle stage 7 has openings whose shapes correspond to the portions of the patterns PT1 to PT4. For this reason, the flatness of the patterns PT1 and PT4 can be advantageously improved as compared with the first embodiment.

During the actual exposure, alignment between the alignment marks AM of the reticles R1 and R2 and the wafer marks attached to the wafer area subjected to exposure is monitored by alignment sensors 21a and 21b (i.e., so-called die-by-die alignment). Preferably, after at least one of a wafer and reticle stages 13 and 7 is slightly shifted such that the marks are aligned with each other, exposure is performed. In this case, since alignment precision of the reticles R1 to R4 with respect to the reticle stage 7 need not be high, each alignment cycle time can be shortened although four alignment cycles must be performed. Alignment precision (e.g., ±2 μm) can be given such that alignment marks AM of the reticles are located within the detection fields of the alignment sensors 21a and 21b upon alignment of the central point of the pattern of the reticle with the optical axis AX. When so-called die-by-die alignment is performed, a linear encoder or the like may be used in place of the detector 11 as the reticle coordinate detector.

When the reticle and wafer stages 7 and 13 are shifted on the basis of open control as in the first embodiment, after the reticles R1 to R4 are chucked on the stage 7, the distances between the central exposure points of the reticles must be measured. In this case, alignment between the reverse projected images (from the projection lens 12) of the fudicial marks on the wafer stage 13 and the alignment marks AM of the reticles R1 to R4 is detected by the alignment sensors 21a and 21b, and the positions of the reticle and wafer stages 7 and 13 are calculated such that these marks are aligned with each other. Relative positions of the central exposure points of the patterns PT1 to PT4 are derived from the calculated positions described above.

It is also effective to arrange a $\theta$ table for correcting a rotational angle $\theta$ of each of the reticles R1 to R4.

Figure 8:
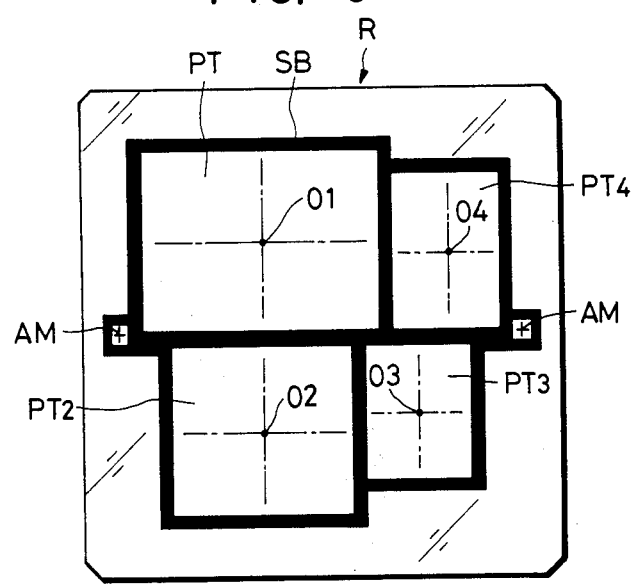
FIG. 8 is a plan view showing another pattern of the reticle.

The present invention is described with reference to the particular embodiments, but is not limited thereto. Various changes and modifications may be made within the spirit and scope of the invention. FIG. 8 is a plan view of a reticle having a plurality of patterns as in the first embodiment. Right and left marks AM of the reticle R are used in die-by-die alignment (or reticle alignment). In this modification, a light-shielding band SB between the adjacent patterns is commonly used by the adjacent patterns. The width of the light-shielding pattern SB is identical for the patterns PT1, PT2, PT3, and PT4. For this reason, the effective area of the pattern can be increased, thus advantageously allowing flexibility of pattern disposition. In this manner, when a plurality of patterns are formed on one reticle, since the positional relationships between the central exposure points (O1, O2, O3, and O4) of the patterns are predetermined, only one die-by-die alignment mark may be formed on the reticle. In addition, since the reticle stage 7 has a large stroke, the mark position is not limited to the peripheral portion of the reticle, but may be formed at a central portion thereof if allowed in consideration of the stroke.

Even if a plurality of patterns are formed on one reticle, or a plurality of reticles are chucked on the reticle stage, the reticle stage itself may be rotated along the $\theta$-axis, and a sensor for reading the rotational angle with high precision may be arranged.

The present invention is also applicable to an X-ray exposure apparatus of a proximity type step-and-repeat system. In this case, a line connecting between an X-ray source and an X-ray mask (or a wafer) corresponds to the optical axis of the projection lens. A mask blind corresponding to the reticle blind is arranged between the X-ray mask and the X-ray source.

What is claimed is:

1. A projection exposure apparatus comprising means for supporting a plurality of patterns in a predetermined positional relationship, each of the plurality of patterns being disposed in a respective area of a plurality of different areas on a first plane;
    light-shielding means disposed on the first plane to encircle each of the plurality of patterns;
    means for supporting a substrate on a second plane;
    a projection optical system arranged between the first and the second planes;
    means for two-dimensionally moving the plurality of patterns along the first plane while maintaining the predetermined positional relationship, the plurality of patterns being moved such that the plurality of patterns sequentially intersect with an optical axis of said projection optical system; and
    means for two-dimensionally moving said substrate along the second plane.

2. An apparatus according to claim 1, wherein said plurality of patterns are formed on a mask and said light-shielding means includes a light-shielding band surrounding each of said patterns.

3. An apparatus according to claim 1, wherein said substrate is shifted such that images of the plurality of patterns formed thereon do not overlap at a plurality of different positions on the substrate.

4. A projection exposure apparatus comprising:
    means for supporting a plurality of patterns in a predetermined positional relationship, each of the plurality of patterns being disposed in a respective area of a plurality of different areas on a first plane;
    means for supporting a substrate on a second plane;
    a projection optical system arranged between the first and the second planes;
    means for two-dimensionally moving the plurality of patterns along the first plane while maintaining the predetermined positional relationship, the plurality of patterns being moved such that the plurality of patterns sequentially intersect with an optical axis of said projection optical system;
    means for two-dimensionally moving said substrate along the second plane;
    first position detecting means for detecting moving positions of the plurality of patterns on the first plane; and
    second position detecting means for detecting a moving position of the substrate on the second plane.

5. An apparatus according to claim 4, wherein said first position detecting means includes first reflecting means which has a surface of reflection normal to said first plane and moving together with said plurality of patterns and first measuring means for measuring a position of the surface of reflection of the first reflecting means, and said second position detecting means includes second reflecting means which has a surface of reflection normal to said second plane and moving together with said substrate and second measuring means for measuring a position of the surface of reflection of the second reflecting means.

6. An apparatus according to claim 5, wherein said first reflecting means includes an x-reflection surface and a y-reflection surface which are normal to each other, and said second reflecting means includes an x-reflection surface in parallel with the x-reflection surface of the first reflecting means and a y-reflection surface in parallel with the y-reflection surface of the first reflecting means.

7. An apparatus according to claim 6, wherein said first measuring means includes a first interferometer which has a measuring axis normal to the x-reflection surface of said first reflecting means and a second interferometer which has a measuring axis normal to the y-reflection surface of the first reflecting means, and said second measuring means includes a third interferometer which has a measuring axis normal to the x-reflection surface of said second reflecting means and a fourth interferometer which has a measuring axis normal to the y-reflection surface of the second reflecting means.

8. An apparatus according to claim 7, wherein said first plane is parallel with said second plane.

9. A projection exposure apparatus comprising:
means for supporting a plurality of patterns in a predetermined positional relationship, each of the plurality of patterns being disposed in a respective area of a plurality of different areas on a first plane;
means for supporting a substrate on a second plane;
a projection optical system arranged between the first and the second planes;
first moving means for two-dimensionally moving the plurality of patterns along the first plane while maintaining the predetermined positional relationship, the plurality of patterns being moved such that the plurality of patterns sequentially intersect with an optical axis of said projection optical system;
second moving means for two-dimensionally moving said substrate along the second plane;
means for supplying an energy beam onto each pattern intersecting with the optical axis of said projection optical system, the supplying means including image-forming optical means and a light-shielding member which is arranged conjugate to the first plane with respect to the image-forming optical means and having an opening of adjustable size, said projection optical system forming images of said patterns on said substrate; and
means for operating said light-shielding member so as to conform the size of an image of the opening formed on the first plane by said image-forming optical means to the size of the pattern intersecting with the optical axis of said projection optical system every time the pattern intersecting with the optical axis is replaced with another pattern by said first moving means.

10. An apparatus according to claim 9, further comprising light-shielding means arranged on said first plane to encircle each of said patterns.

11. An apparatus according to claim 10, wherein said plurality of patterns are formed on a mask and said light-shielding means includes a light-shielding band which surrounds each of said plurality of patterns.

12. An apparatus according to claim 9, further comprising means for detecting moving positions of said plurality of patterns in said first plane.

* * * * *